US012708017B2

(12) United States Patent
Mandalapu et al.

(10) Patent No.: US 12,708,017 B2
(45) Date of Patent: Aug. 11, 2026

(54) SYSTEMS AND METHODS FOR MULTI-TIER MULTI-DIE MODULES

(71) Applicant: Advanced Micro Devices, Inc., Santa Clara, CA (US)

(72) Inventors: Chandra Sekhar Mandalapu, Fort Collins, CO (US); Rahul Agarwal, Santa Clara, CA (US); Raja Swaminathan, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 901 days.

(21) Appl. No.: 17/930,640

(22) Filed: Sep. 8, 2022

(65) Prior Publication Data

US 2025/0293203 A1 Sep. 18, 2025

(51) Int. Cl.
*H10W 90/00* (2026.01)
*H10W 72/00* (2026.01)
*H10W 80/00* (2026.01)

(52) U.S. Cl.
CPC ....... *H10W 72/0198* (2026.01); *H10W 90/00* (2026.01); *H10W 80/211* (2026.01); *H10W 80/312* (2026.01); *H10W 80/327* (2026.01); *H10W 90/721* (2026.01); *H10W 90/792* (2026.01)

(58) Field of Classification Search
None
See application file for complete search history.

(56) References Cited

U.S. PATENT DOCUMENTS 10,388,609 B2 * 8/2019 Ohmart .................. H01L 22/30
10,797,062 B1 * 10/2020 Nishikawa ............. H10D 88/00
11,587,943 B2 * 2/2023 Nishikawa ............. H10B 41/27
11,605,620 B2 * 3/2023 Lan ......................... H01L 24/05
2016/0141251 A1 * 5/2016 Ohmart ............. G01R 31/2831 257/48
2017/0309502 A1 * 10/2017 Park .................. H01L 21/67144
2020/0335512 A1 * 10/2020 Nishikawa ............. H01L 24/48
2020/0402990 A1 * 12/2020 Nishikawa ............. H10B 41/27
2021/0375819 A1 * 12/2021 Chen ....................... H01L 24/08
2022/0359461 A1 * 11/2022 Chang .................. H01L 25/105
2022/0415837 A1 * 12/2022 Jun ......................... H01L 24/08
2023/0103629 A1 * 4/2023 Chen ....................... H01L 24/92 257/737
2023/0352439 A1 * 11/2023 Chen ....................... H01L 24/94

FOREIGN PATENT DOCUMENTS

CN 110892521 A * 3/2020 ............ H01L 24/95

* cited by examiner

*Primary Examiner* — Telly D Green
(74) *Attorney, Agent, or Firm* — Greenberg Traurig, LLP

(57) ABSTRACT

The disclosed computer-implemented method for multi-tier multi-die modules may include bonding a front side of a first plurality of dies to a first carrier, forming a first wafer; preparing a back-side surface of the first wafer for hybrid bonding; bonding a back side of a second plurality of dies to a second carrier, forming a second wafer; preparing a front-side surface of the second wafer for hybrid bonding; and hybrid bonding the first wafer with the second wafer. Various other methods, apparatuses, and systems are also disclosed.

20 Claims, 11 Drawing Sheets

SYSTEMS AND METHODS FOR MULTI-TIER MULTI-DIE MODULES

BACKGROUND

A 3D stacked die package can be built using tools to bond one layer of elements to another layer of elements.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
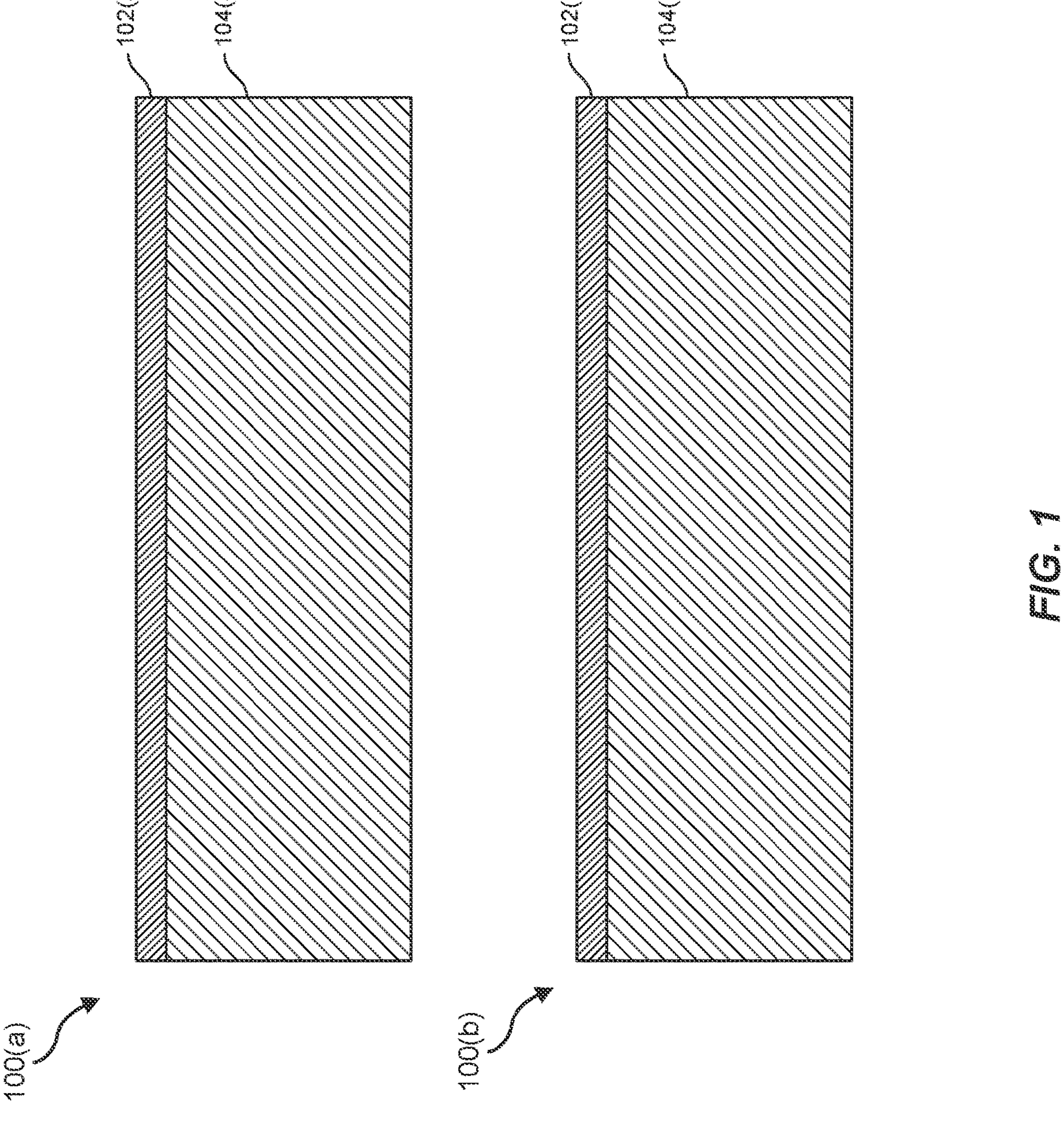
FIG. 1 is an illustration of an example intermediate apparatus in a method of manufacture for multi-tier multi-die modules.

Throughout the drawings, identical reference characters and descriptions indicate similar, but not necessarily identical, elements. While the example implementations and variations described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to methods, apparatuses, and systems for multi-tier multi-die modules. Some bonding tool systems can be limited in terms of how many different die types can be used, in some cases at least partly due to the impact on queue time and the potential for defects. Methods of manufacturing described herein can potentially achieve high throughput with relatively few defects, even, in some examples, with the use of otherwise limited bonding tool systems.

In some implementations, two tiers of wafers (e.g., a tier 1 and a tier 2) can be prepared independently. For the tier 1 wafer, different die types can be bonded to a silicon carrier (e.g., using a chip-on-wafer process) and the backside surface can be prepared for hybrid bonding. For the tier 2 wafer, the backside surface can be prepared using temporary adhesive bonding (or a sacrificial permanent bonding) while the front surface can be prepared for hybrid bonding. Hybrid wafer-to-wafer bonding of the tier 1 and tier 2 wafers can be performed. The tier 1 carrier can then be removed, and bumping, dicing, and substrate attachment can be performed. In some variations, the process can be extended to multiple tiers. For example, instead of performing bumping after removal of the tier 1 carrier, the surface can be prepared for hybrid bonding. A chip-on-wafer or wafer-on-wafer bonding can then be performed to extend the module to multiple tiers (e.g., 3 or more). This approach to manufacturing multi-die, multi-tier modules can enable the use of multiple known good dies of different die types on different tiers. In addition, this approach can avoid the need for expensive tool upgrades or development. Furthermore, this approach can enable manufacturing in parallel, improving cycle time.

The following will provide, with reference to FIGS. 1-12, detailed descriptions of example methods of manufacture and intermediate apparatuses for multi-tier multi-die modules.

FIG. 1 is an illustration of example intermediate apparatuses 100(*a*) and 100(*b*) in a method of manufacture for multi-tier multi-die modules. As will be explained in greater detail below, in some variations FIG. 1 can represent a step in constructing a first tier of a multi-tier module.

Apparatuses 100(*a*) and 100(*b*) can represent wafers. Wafer 100(*a*) can include a front layer 102(*a*) and a substrate 104(*a*). Front layer 102(*a*) can include multiple dies. Similarly, wafer 100(*b*) can include a front layer 102(*b*) and a substrate 104(*b*). Front layer 102(*b*) can include multiple dies. In some implementations, wafer 100(*a*) can include one type of die. Wafer 100(*b*) can also include one type of die. Wafer 100(*a*) can include a different die type than does wafer 100(*b*). Substrates 104(*a*) and (*b*) can include any suitable material. In some examples, substrates 104(*a*) and (*b*) can include a semiconductor material. For example, substrates 104(*a*) and (*b*) can include silicon.

While FIG. 1 illustrates two wafers, accounting for two different die types, in some variations the method of manufacture can make use of many different die types (e.g., 3 or more, 6 or more, etc.) for the first tier of the multi-tier module. As used herein, the term "die type" can designate a die design, a die function, and/or a particular process form which a die originated. Thus, for example, a processor die and a memory die can be understood as two different die types. Examples of die types include, without limitation, processor dies of particular designs, memory dies of particular designs, hardware accelerators of particular designs, etc.

Figure 2:
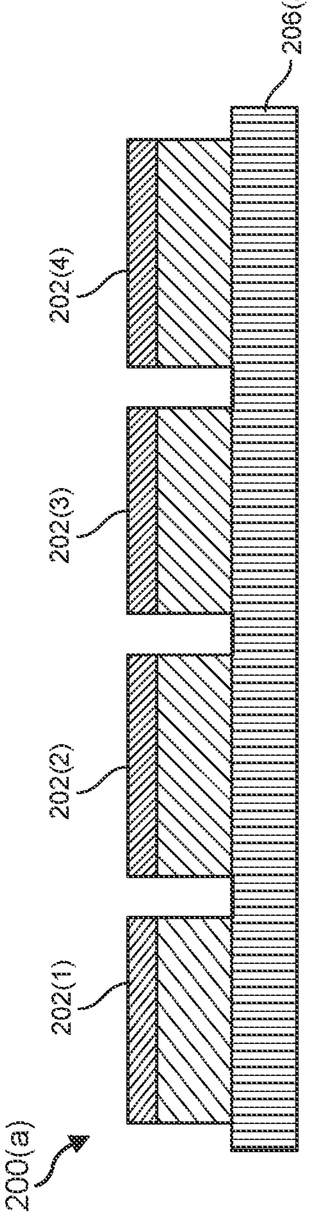
FIG. 2 is an illustration of an example intermediate apparatus in a method of manufacture for multi-tier multi-die modules.
Figure 2:
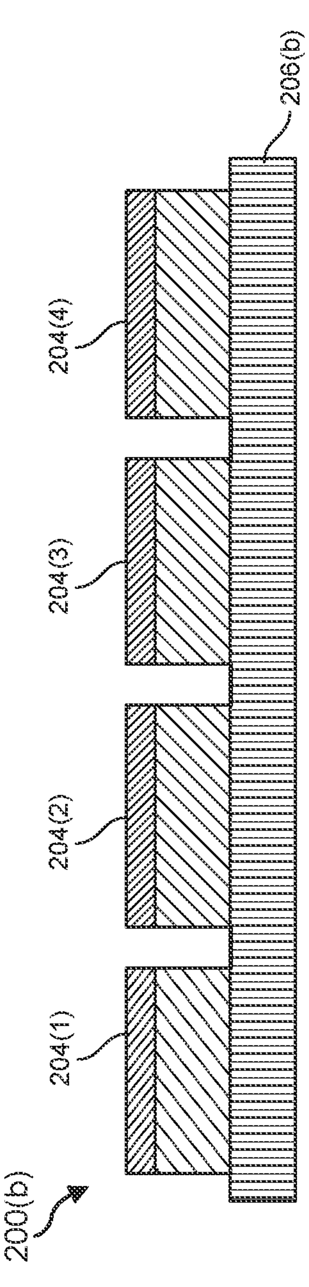

FIG. 2 is an illustration of an example intermediate apparatuses 200(*a*) and 200(*b*) in a method of manufacture for multi-tier multi-die modules. As shown in FIG. 2, wafer 100(*a*) can be ground and diced into multiple singulated dies (including, e.g., dies 202(1)-(4) and situated on a substrate 206(*a*) to form a reconstituted wafer 200(*a*). Likewise, wafer 100(*b*) can be ground and diced into multiple singulated dies (including, e.g., dies 204(1)-(4)) and situated on a substrate 206(*b*) to form a reconstituted wafer 200(*b*).

Figure 3:
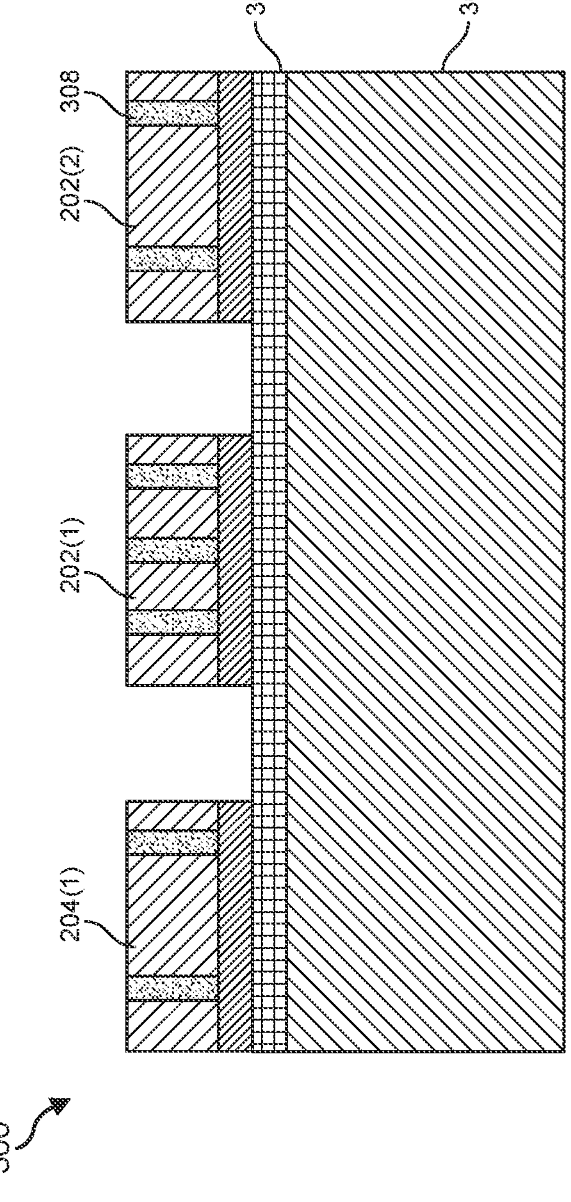
FIG. 3 is an illustration of an example intermediate apparatus in a method of manufacture for multi-tier multi-die modules.

FIG. 3 is an illustration of an example intermediate apparatus 300 in a method of manufacture for multi-tier multi-die modules. As shown in FIG. 3, apparatus 300 can include a carrier 304, a bonding layer 306, and multiple dies coupled to bonding layer 306, including, for example, dies 204(1), 202(1), and 202(2) of FIG. 2. As can be appreciated, dies 202(1)-(2) are a different type of die than 204(1), such that apparatus 300 can include varying die types. While FIG. 3 illustrates apparatus 300 as including two different die types, as can be appreciated, through the use of more wafers of different die types in the steps illustrated in FIGS. 1-2, apparatus 300 can include a desired number of die types (e.g., 6 or more). In addition, dies of any number and with any relative placement or configuration can be used.

In some examples, the method of manufacture may include selecting dies 204(1), 202(1), and 202(2) based at least in part on these dies being known good dies. As used herein, the term "known good die" can refer to any die that has been tested, inspected and/or otherwise validated as functional and/or falling within predetermined specifications. Thus, for example, one or more of the methods described herein may include performing one or more tests and/or validation procedures on one or more of dies 202(1)-(4) and 204(1)-(4). Examples include, without limitation, a burn-in procedure, a voltage stress test, a temperature stress test, a low voltage sweep, etc. The method may include performing measurements and/or tests at any suitable time. For example, the method may include use of a wafer prober to test each die of wafers 100(*a*) and 100(*b*).

Carrier 304 can include any suitable material. In some examples, carrier 304 can be a semiconductor material. For example, carrier 304 can include silicon.

Dies 204(1), 202(1), and 202(2) can be coupled to carrier 304 in any suitable manner. For example, dies 204(1), 202(1), and 202(2) can be bonded to carrier 304 using a chip-on-wafer bonding process. In some examples, dies 204(1), 202(1), and 202(2) can be bonded to carrier 304 using oxide bonding. In one example, bonding layer 306 can include an adhesive material.

As shown in FIG. 3, dies 204(1), 202(1), and 202(2) can include one or more vias 308. Vias 308 can be constructed any suitable time including, e.g., before or after bonding dies 204(1), 202(1), and 202(2) to carrier 304. Vias 308 can include any suitable material. For example, vias 308 can include copper.

As noted above, in some variations dies 204(1), 202(1), and 202(2) may have been tested and classified as known good dies before being coupled to carrier 304. Accordingly, apparatus 300 may have a low defect rate.

Figure 4:
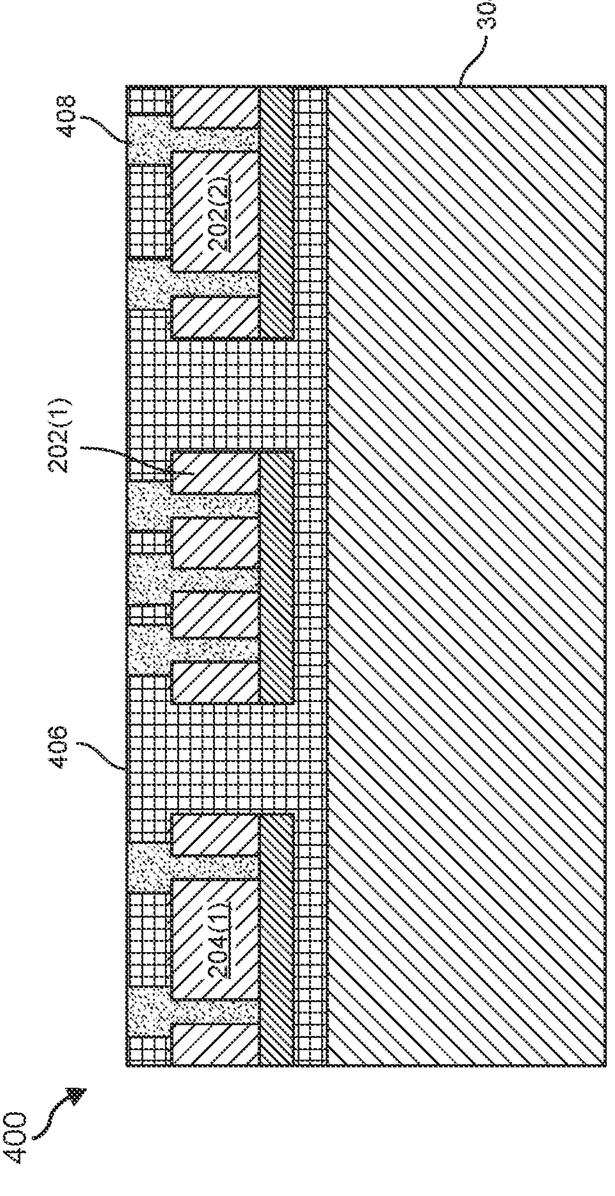
FIG. 4 is an illustration of an example intermediate apparatus in a method of manufacture for multi-tier multi-die modules.

FIG. 4 is an illustration of an example intermediate apparatus 400 in a method of manufacture for multi-tier multi-die modules. As shown in FIG. 4, the method can include preparing a back-side surface of apparatus 400 for hybrid bonding. For example, the method can include revealing one or more of vias 308 from FIG. 3. Additionally or alternatively, the method can include coupling one or more bond pads 408 to one or more of vias 308. In some variations, the method can include a deposition process to add a hybrid bonding material 406. Hybrid bonding material 406 can include any suitable material. For example, hybrid bonding material 406 can include an oxide. In some variations, hybrid bonding material 406 can include silicon dioxide. In addition, the method can include backgrinding, polishing, and/or cleaning the back-side surface of apparatus 400.

Figure 5:
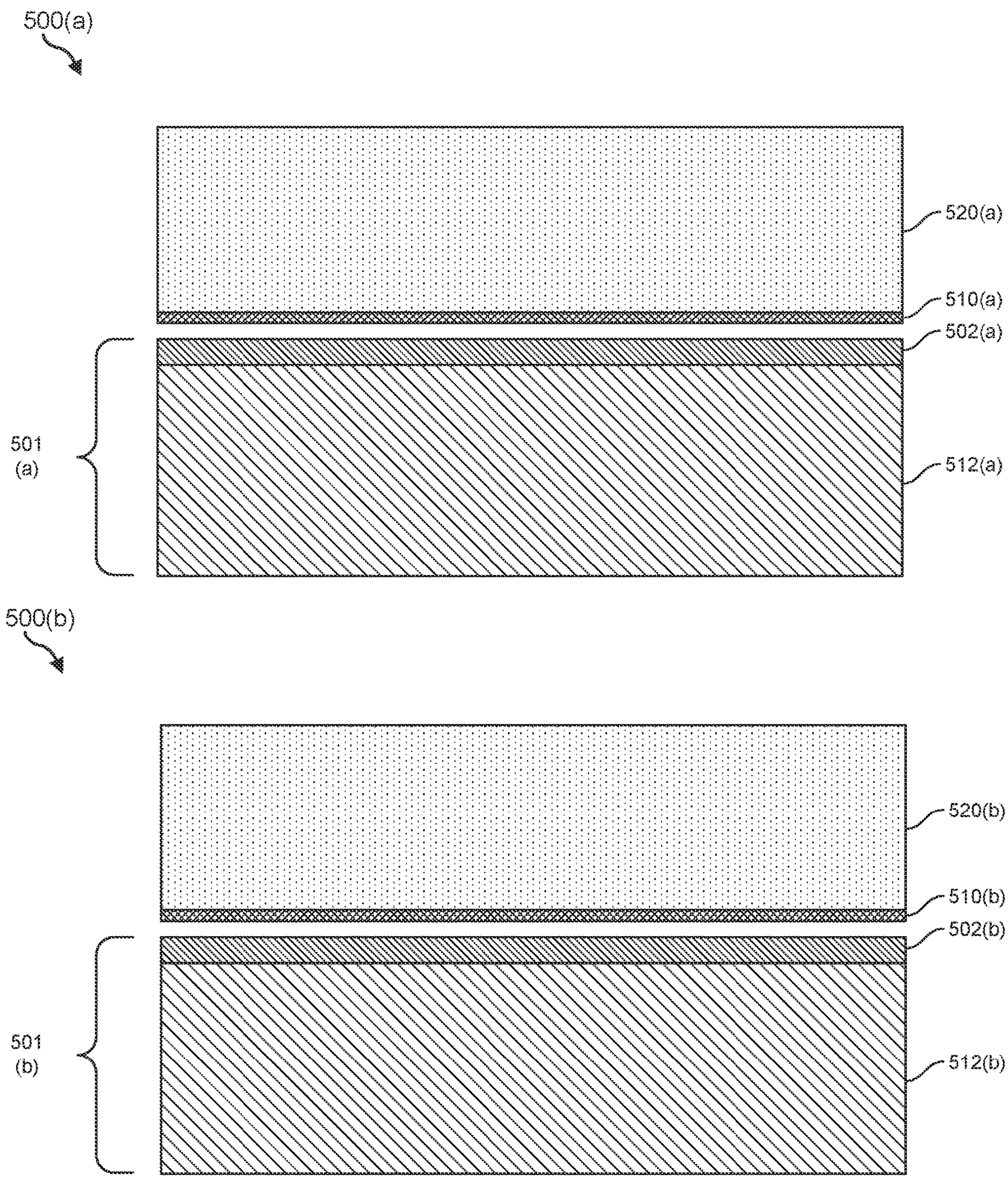
FIG. 5 is an illustration of an example intermediate apparatus in a method of manufacture for multi-tier multi-die modules.

FIG. 5 is an illustration of an example intermediate apparatuses 500(*a*) and 500(*b*) in a method of manufacture for multi-tier multi-die modules. As will be explained in greater detail below, in some variations FIG. 5 can represent a step in constructing a second tier of a multi-tier module.

As shown in FIG. 5, apparatus 500(*a*) can include a glass carrier 520(*a*) and a wafer 501(*a*). Apparatus 500(*b*) can include a glass carrier 520(*b*) and a wafer 501(*b*). Wafer 501(*a*) can include a front layer 502(*a*) and a substrate 504(*a*). Front layer 502(*a*) can include multiple dies. Similarly, wafer 501(*b*) can include a front layer 502(*b*) and a substrate 504(*b*). Front layer 502(*b*) can include multiple dies. In some implementations, wafer 501(*a*) can include one type of die. Wafer 501(*b*) can also include one type of die. Wafer 501(*a*) can include a different die type than does wafer 501(*b*). Substrates 504(*a*) and (*b*) can include any suitable material. In some examples, substrates 504(*a*) and (*b*) can include a semiconductor material. For example, substrates 504(*a*) and (*b*) can include silicon. In some examples, wafers 501(*a*) and 502(*a*) can be understood as "upper-tier wafers." The term "upper-tier wafers," as used herein, can refer to any wafers including dies to be used in an upper tier (e.g., tier 2 or higher) of a multi-tier module.

While FIG. 5 illustrates two wafers, accounting for two different die types, in some variations the method of manufacture can make use of many different die types (e.g., 3 or more, 6 or more, etc.) for the second tier of the multi-tier module (thus, e.g., making use of additional wafers and glass carriers).

In some implementations, the method can include temporarily bonding wafer 501(*a*) to glass carrier 520(*a*) and wafer 501(*b*) to glass carrier 520(*b*). For example, the method can include an adhesive bonding process. In one implementation, the method can include applying a temporary adhesive 510(*a*) to glass carrier 520(*a*) and a temporary adhesive 510(*b*) to glass carrier 520(*b*).

While FIG. 5 illustrates the use of glass carriers with temporary adhesive for temporary bonding, in some implementations one or more of the methods described herein can instead bond (e.g., using a permanent bonding process) the wafers to sacrificial carriers.

Figure 6:
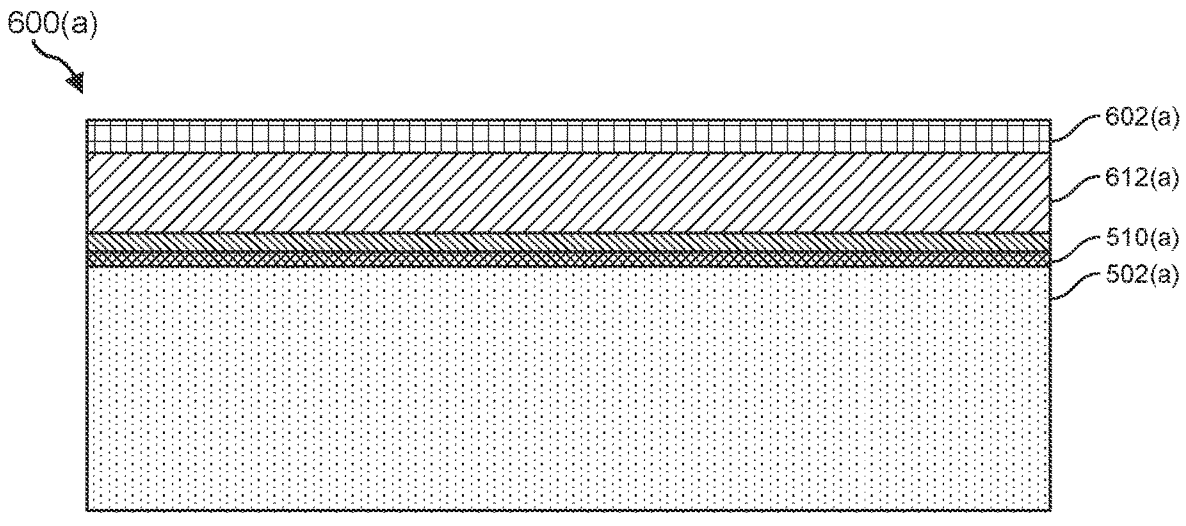
FIG. 6 is an illustration of an example intermediate apparatus in a method of manufacture for multi-tier multi-die modules.
Figure 6:
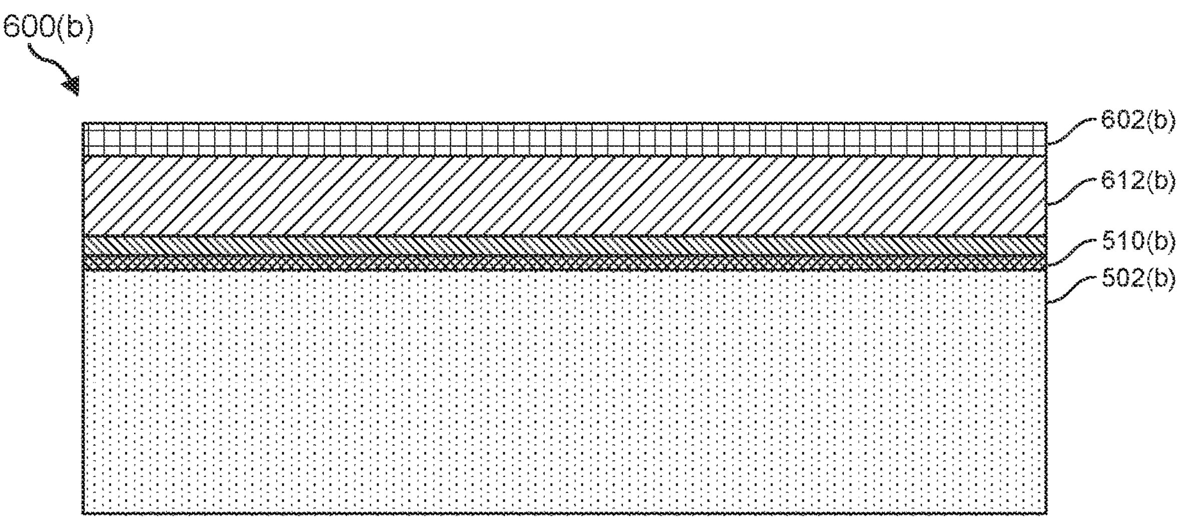

FIG. 6 is an illustration of example intermediate apparatuses 600(*a*) and 600(*b*) in a method of manufacture for multi-tier multi-die modules. As shown in FIG. 6, the method can include thinning the wafers, resulting in thinner substrates 612(*a*) and 612(*b*). In addition, the method can include preparing the back-side surfaces of the wafers (e.g., to later be bonded to carriers, as will be discussed further below).

Figure 7:
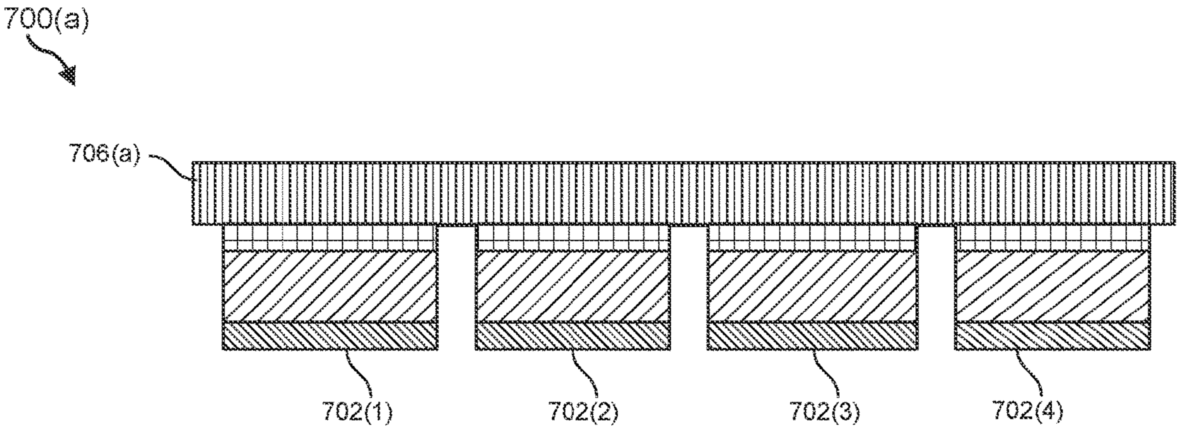
FIG. 7 is an illustration of an example intermediate apparatus in a method of manufacture for multi-tier multi-die modules.
Figure 7:
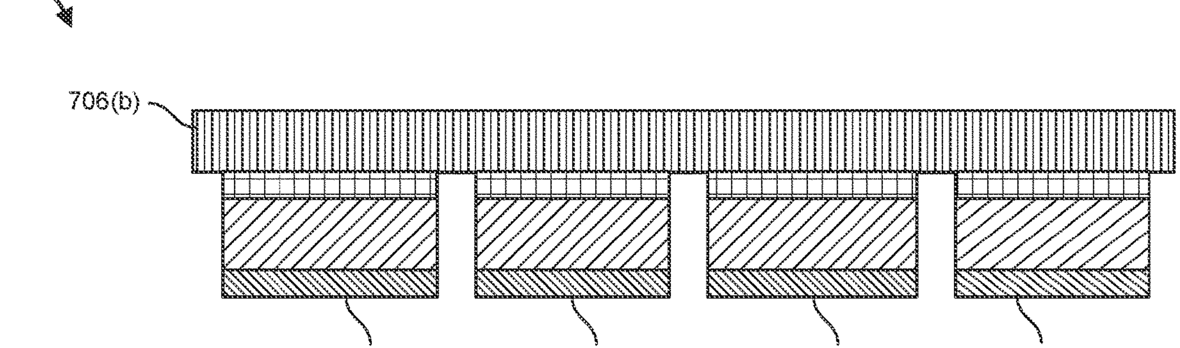

FIG. 7 is an illustration of example intermediate apparatuses 700(*a*) and 700(*b*) in a method of manufacture for multi-tier multi-die modules. As shown in FIG. 7, wafers 501(*a*) and 501(*b*) can be diced into multiple dies (including, e.g., dies 702(1)-(4) from wafer 501(*a*) and dies 704(1)-(4) from wafer 501(*b*)). In addition, glass carriers 520(*a*) and 520(*b*) can be de-bonded from wafers 501(*a*) and 501(*b*), respectively (by, e.g., dissolving temporary adhesive 510(*a*) and 510(*b*)). Thus, apparatus 700(*a*) can include a carrier 706(*a*) with dies 702(1)-(4) and a carrier 706(*b*) with dies 704(1)-(4).

Figure 8:
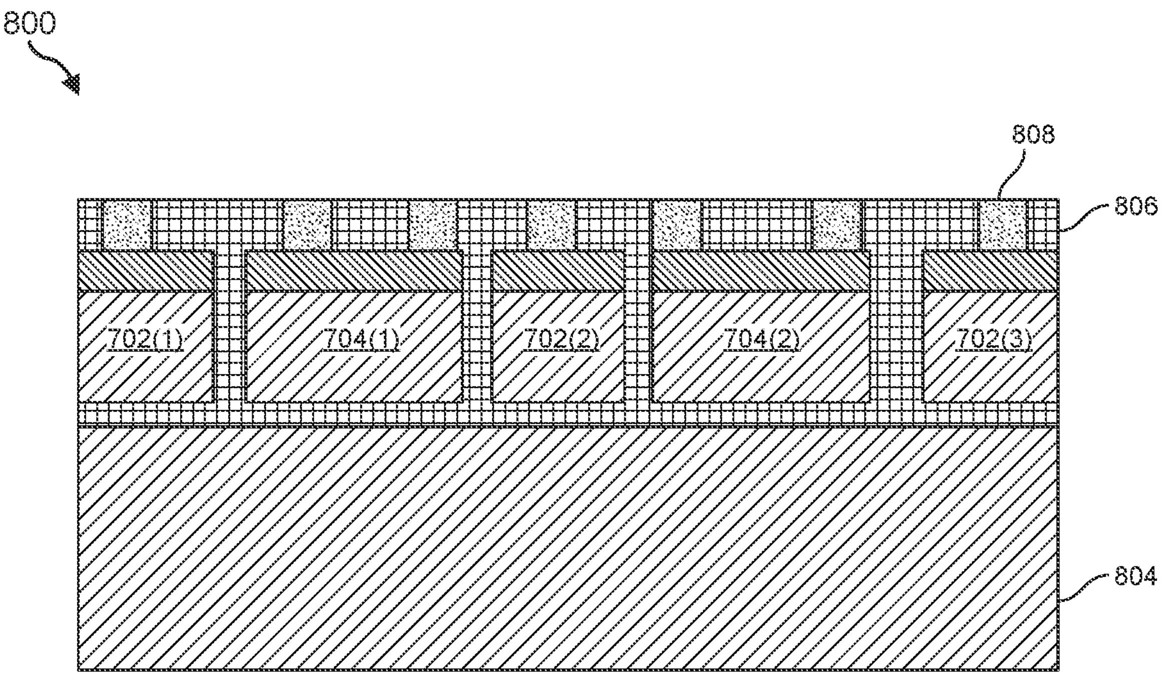
FIG. 8 is an illustration of an example intermediate apparatus in a method of manufacture for multi-tier multi-die modules.

FIG. 8 is an illustration of an example intermediate apparatus 800 in a method of manufacture for multi-tier multi-die modules. As shown in FIG. 8, apparatus 800 can include a carrier 804. One or more of the dies from apparatuses 700(*a*) and 700(*b*) can be coupled to carrier 804. For example, dies 702(1), 704(1), 702(2), 704(2), and 702(3) can be coupled to carrier 804. In some examples, dies 702(1)-(3) and 704(1)-(2) can be bonded to carrier 804 using a chip-on-wafer bonding process (e.g., oxide bonding).

As can be appreciated, dies 702(1)-(3) are a different type of die than dies 704(1)-(2), such that apparatus 800 can include varying die types. While FIG. 8 illustrates apparatus 800 as including two different die types, as can be appreciated, through the use of more wafers of different die types in the steps illustrated in FIGS. 5-6, apparatus 800 can include a desired number of die types (e.g., 6 or more). In addition, dies of any number and with any relative placement or configuration can be used.

In some examples, the method of manufacture may include selecting dies 702(1)-(3) and 704(1)-(2) based at least in part on these dies being known good dies. Thus, for example, one or more of the methods described herein may include performing one or more tests and/or validation procedures on one or more of dies 702(1)-(4) and 704(1)-(4). For example, the method may include use of a wafer prober to test each die of wafers 501(*a*) and 501(*b*).

The method can also include coupling one or more bond pads to dies 702(1)-(3) and 704(1)-(2). In some variations, the method can include a deposition process to add a hybrid bonding material 806. Hybrid bonding material 806 can include any suitable material. For example, hybrid bonding material 806 can include an oxide. In some variations, hybrid bonding material 806 can include silicon dioxide. In addition, the method can include polishing and/or cleaning the front-side surface of apparatus 800.

As can be appreciated, in some implementations the method steps illustrated in FIGS. 1-4 (fabricating and preparing the tier 1 wafer) can be performed independently of the method steps illustrated in FIGS. 5-8 (fabricating and preparing the tier 2 wafer). Accordingly, in various implementations, any of the steps portrayed in FIGS. 1-4 can be performed in parallel with any of the steps portrayed in FIGS. 5-8.

Figure 9:
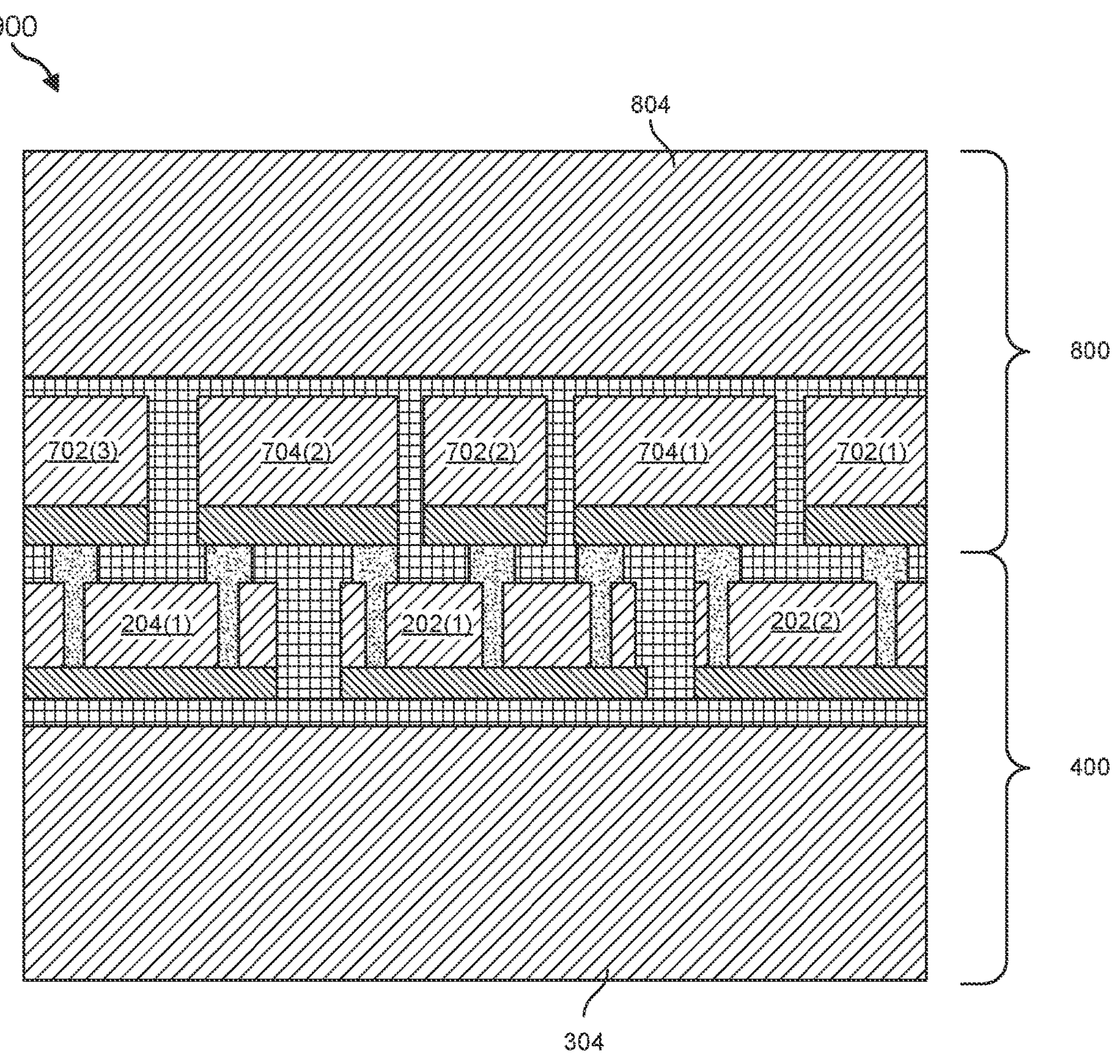
FIG. 9 is an illustration of an example intermediate apparatus in a method of manufacture for multi-tier multi-die modules.

FIG. 9 is an illustration of an example intermediate apparatus 900 in a method of manufacture for multi-tier multi-die modules. As shown in FIG. 9, apparatus 400 of FIG. 4 and apparatus 800 of FIG. 8 can be bonded together using a hybrid bonding process. As used herein, the term "hybrid bonding" can refer to any type or form of hybrid bonding, fusion bonding, and/or direct bonding process. In some examples, a hybrid bonding process can include bonding two wafers including, e.g., bonding surface conductor materials (e.g., copper).

As shown in FIG. 9, bond pads 408 of apparatus 400 (as seen in FIG. 4) can be bonded with bond pads 808 of apparatus 800 (as seen in FIG. 8), forming connections between tier 1 dies (e.g., dies 204(1) and 202(1)-(2)) and tier 2 dies (e.g., dies 702(1)-(3) and 704(1)-(2)).

Figure 10:
FIG. 10 is an illustration of an example intermediate apparatus in a method of manufacture for multi-tier multi-die modules.
Figure 10:
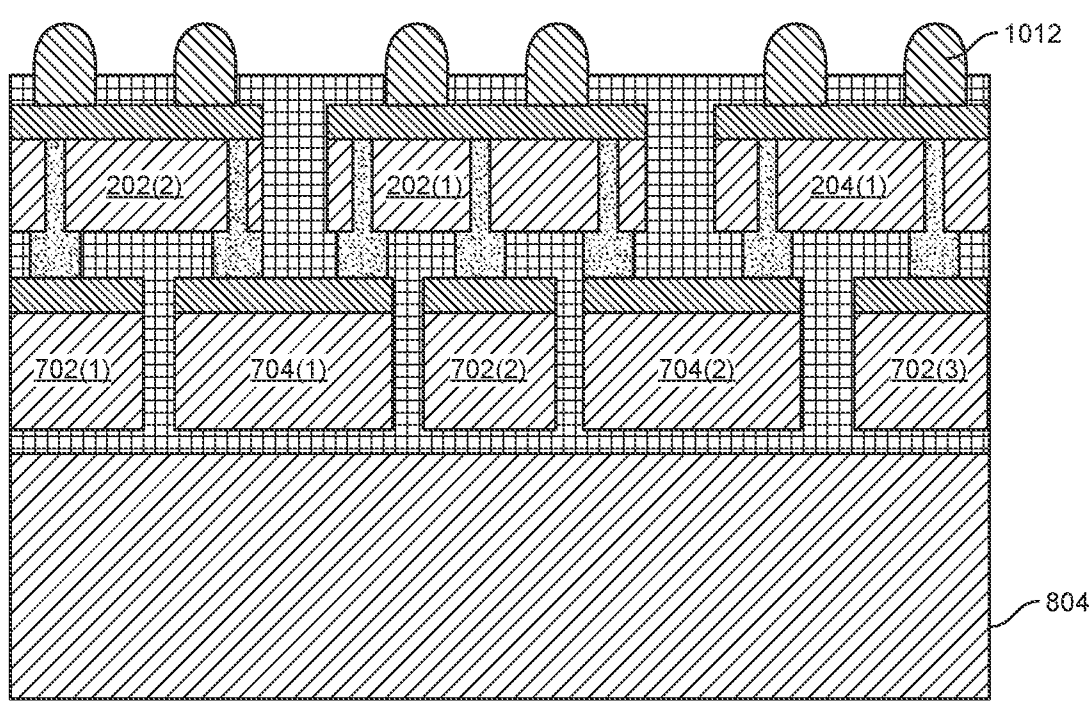

FIG. 10 is an illustration of an example intermediate apparatus 1000 in a method of manufacture for multi-tier multi-die modules. As shown in FIG. 10, carrier 400 can be removed from intermediate apparatus 900, exposing the tier 1 layer in apparatus 1000. In addition, in some variations, the method can include bumping the tier 1 layer, resulting in one or more bumps 1012. In some variations, the method can also include dicing, resulting in a singulated apparatus 1000 (e.g., from a larger context, not pictured).

In some implementations, instead of bumping the front surface of apparatus 1000 as depicted in FIG. 10, one or more of the methods described herein can include preparing the front surface of apparatus 1000 for hybrid bonding. Then, in some variations, the method can include wafer-on-wafer bonding (e.g., hybrid bonding) an additional wafer (e.g., prepared according to the method described in FIGS. 5-8) to the front surface of apparatus 1000. In variations implementations, this sequence can be repeated until a desired number of tiers is reached. In some variations, the last-applied tier can be applied using a chip-on-wafer bonding process. In various examples, the method includes bumping the front surface of the last-applied tier.

Figure 11:
FIG. 11 is an illustration of an example intermediate apparatus in a method of manufacture for multi-tier multi-die modules.
Figure 11:
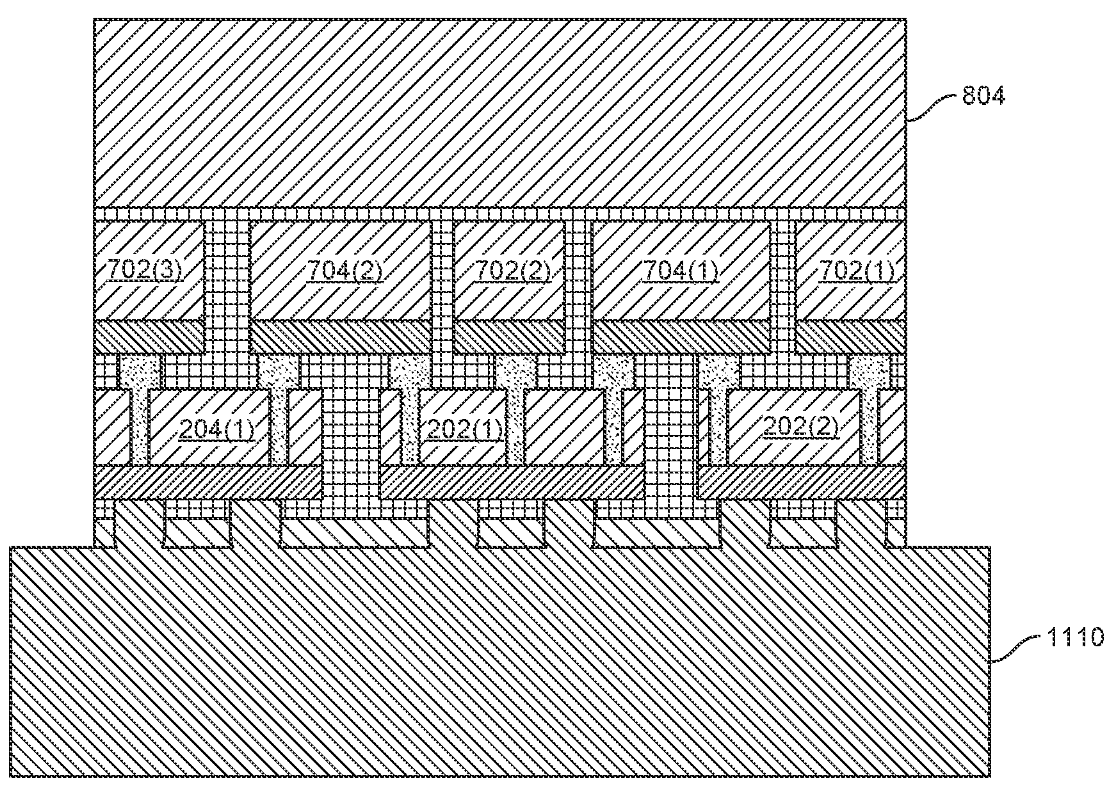

FIG. 11 is an illustration of an example apparatus 1100 in a method of manufacture for multi-tier multi-die modules. As shown in FIG. 11, apparatus 1000 of FIG. 10 can be attached to substrate 1110, forming apparatus 1100.

As can be appreciated, apparatus 1100 can represent a multi-tier module with multiple die types on each tier. Although apparatus 1100 shows two tiers, as discussed earlier, the methods described herein can apply to building a module with an arbitrary number of tiers (e.g., 3 or more). In addition, although each tier of apparatus 1100 shows two types of die, as discussed earlier, the methods described herein can apply to building a module with an arbitrary number of die types in each tier (e.g., 3 or more, 6 or more, etc.). In addition, as discussed above, the production of each tier can be performed separately and independently, allowing for parallel processing, potentially resulting in a higher throughput. Furthermore, as discussed above, dies in the multi-tier module can be validated as known good dies before integration into the multi-tier module, potentially allowing for greater efficiency.

While the foregoing disclosure sets forth various implementations and variations using specific diagrams, process flows, and examples, each diagram component, flow step, operation, and/or component described and/or illustrated herein can be implemented, individually and/or collectively, using a wide range of configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while some of the steps illustrated and/or described herein are be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The implementations and variations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including"

and "having" (and their derivatives), as used in the specification and claims, are interchangeable with and have the same meaning as the word "comprising."

What is claimed is:

1. An apparatus comprising:
a first tier comprising a first plurality of dies of differing die types, each of the first plurality of dies comprising:
a first front layer;
a first substrate layer;
one or more vias extending from the first front layer and through the first substrate layer; and
one or more bonding pads coupled to the one or more vias; and
a second tier comprising a second plurality of dies of differing die types, each of the second plurality of dies comprising a second front layer coupled to at least one of the one or more bonding pads, wherein the second tier is bonded to the first tier via wafer-to-wafer bonding.

2. The apparatus of claim 1, wherein:
the first plurality of dies were selected as known good dies prior to the wafer-to-wafer bonding; and
the second plurality of dies were selected as known good dies prior to the wafer-to-wafer bonding.

3. The apparatus of claim 1, further comprising a third tier comprising a third plurality of dies, the third plurality of dies comprising differing die types, wherein the third tier is bonded to the second tier.

4. The apparatus of claim 3, wherein the third tier is bonded to the second tier via at least one of:
a chip-on-wafer bonding process; or
a wafer-on-wafer bonding process.

5. The apparatus of claim 1, wherein at least one of the first tier or the second tier comprises at least six die types.

6. The apparatus of claim 1, wherein one or more of the first tier and second tier comprise a plurality of wafers with differing die types.

7. The apparatus of claim 1, wherein:
the first plurality of dies comprises a plurality of types of die; and
the second plurality of dies comprises a plurality of types of die.

8. The apparatus of claim 1, wherein:
a front side of a first plurality of dies is bonded to a first carrier with a chip-on-wafer bonding process, forming a first wafer; and
the first plurality of dies were selected as known good dies prior to the chip-on-wafer bonding process.

9. The apparatus of claim 1, wherein the first tier is attached to a third substrate.

10. The apparatus of claim 1, wherein:
the one or more vias include conductive material therein; and
each conductive material within the one or more vias is coupled to a bonding pad of the one or more bonding pads.

11. The apparatus of claim 10, wherein the first plurality of dies are bonded to the second plurality of dies by the one or more bonding pads.

12. The apparatus of claim 1, wherein the second tier is not attached to a third substrate.

13. The apparatus of claim 1, wherein:
at least one of the first plurality of dies is adjacent to a first hybrid bonding material; and
at least one of the second plurality of dies is adjacent to a second hybrid bonding material.

14. The apparatus of claim 1, wherein the wafer-to-wafer bonding includes bonding surface conductor materials of the first plurality of dies and each the second plurality of dies.

15. A system comprising:
a substrate;
a first tier coupled to the substrate, the first tier comprising a first plurality of dies of differing die types, each of the first plurality of dies comprising:
a first front layer;
a first substrate layer;
one or more vias extending from the first front layer and through the first substrate layer; and
one or more bonding pads coupled to the one or more vias; and
a second tier comprising a second plurality of dies of differing die types, each of the second plurality of dies comprising a second front layer coupled to at least one of the one or more bonding pads, wherein the second tier is bonded to the first tier via wafer-to-wafer bonding.

16. The system of claim 15, wherein at least one of the first tier or the second tier comprises at least six die types.

17. The system of claim 15, wherein:
the one or more vias include conductive material therein; and
each conductive material within the one or more vias is coupled to a bonding pad of the one or more bonding pads.

18. The system of claim 17, wherein the first plurality of dies are bonded to the second plurality of dies by the one or more bonding pads.

19. The system of claim 15, wherein the first tier is attached to a substrate.

20. The system of claim 15, wherein:
at least one of the first plurality of dies is adjacent to a first hybrid bonding material; and
at least one of the second plurality of dies is adjacent to a second hybrid bonding material.

* * * * *